United States Patent [19]

Mandigo et al.

[11] Patent Number: 4,735,678

[45] Date of Patent: Apr. 5, 1988

[54] FORMING A CIRCUIT PATTERN IN A METALLIC TAPE BY ELECTRICAL DISCHARGE MACHINING

[75] Inventors: Frank N. Mandigo, Northford; Brian E. O'Donnelly, Branford, both of Conn.

[73] Assignee: Olin Corporation, New Haven, Conn.

[21] Appl. No.: 37,915

[22] Filed: Apr. 13, 1987

[51] Int. Cl.[4] .......................... C23F 1/02; B44C 1/22; C03C 15/00; C03C 25/06

[52] U.S. Cl. ........................ 156/634; 29/827; 156/643; 156/645; 156/650; 156/654; 156/272.2; 156/345; 156/901; 204/129.5; 204/129.55; 219/69 E; 219/69 M

[58] Field of Search ............. 156/634, 901, 643, 345, 156/645, 650, 651, 654, 272.2, 273.9, 274.4, 274.6, 274.8; 219/68, 69 D, 69 G, 69 E, 69 M, 69 P; 204/129.1, 129.5, 129.55; 29/827; 174/68.5; 357/70; 361/421

[56] References Cited

U.S. PATENT DOCUMENTS

| | | | |
|---|---|---|---|
| 3,292,241 | 12/1966 | Carroll | 29/155.5 |
| 3,781,596 | 12/1973 | Galli et al. | 174/68.5 X |
| 3,832,769 | 9/1974 | Olyphant, Jr. et al. | 174/68.5 X |
| 3,838,984 | 10/1974 | Crane et al. | 174/52 PE |
| 3,868,724 | 2/1975 | Perrino | 357/65 |
| 3,984,620 | 10/1976 | Robillard et al. | 174/52 FP |
| 4,209,355 | 6/1980 | Burns | 156/630 |
| 4,210,926 | 7/1980 | Hacke | 357/70 |
| 4,259,436 | 3/1981 | Tabuchi et al. | 430/314 |
| 4,308,339 | 12/1981 | Lindberg | 430/312 |
| 4,312,117 | 1/1982 | Robillard et al. | 156/644 X |
| 4,396,457 | 8/1983 | Bakermans | 156/634 |
| 4,411,719 | 10/1983 | Lindberg | 156/64 |
| 4,494,688 | 1/1985 | Hatada et al. | 228/180 A |
| 4,510,017 | 4/1985 | Barber | 156/651 |

FOREIGN PATENT DOCUMENTS

55-26613 2/1980 Japan .

OTHER PUBLICATIONS

"TAB Technology Tackles High Density Interconnections", by Tom Dixon, Dec. 1984, vol. of *Electronic Packaging & Production* at pp. 34–39.

"Electrical Discharge Machining (EDM)", by John F. Kahles, *Metals Handbook,* vol. 3, pp. 227 through 233.

*Primary Examiner*—William A. Powell
*Attorney, Agent, or Firm*—Paul Weinstein

[57] ABSTRACT

The present invention is directed to the process of forming a circuit pattern in a strip of metallic tape with an electrical discharge machining apparatus having an electrode and a pool of dielectric material. The electrode, having a negative image of the circuit pattern cut into a first end thereof, is submerged in the dielectric material. By controlling the pulsing of direct current across the gap between the electrode and the strip of metallic material for a period of time, a spark discharging across the gap causes small quantities of the metallic foil to be removed so as to cut the circuit pattern.

16 Claims, 3 Drawing Sheets

FORMING A CIRCUIT PATTERN IN A METALLIC TAPE BY ELECTRICAL DISCHARGE MACHINING

While the invention is subject to a wide range of applications, it is particularly suited for forming circuit patterns in metallic interconnect tape and will be particularly described in that connection. In particular, an electrical discharge machining apparatus is used to manufacture bumped or unbumped tape for use in tape automated bonding (hereinafter referred to as TAB).

A general review of TAB technology is set forth in an article entitled "TAB Technology Tackles High Density Interconnections" by Tom Dixon, which appeared in the Dec., 1984, volume of *Electronic Packaging & Production* at pages 34–39. TAB technology comprises an interconnect technology used to interconnect a semiconductor device to a leadframe, semiconductor package contacts or printed circuit board. TAB is finding increased use commercially because of the trend toward increased circuit density. In most cases, TAB is used to replace conventional wire bonding technology and to provide additional advantages of on line testability and finer circuit configurations. For example, TAB permits closer spacing of interconnect bonding pads on the semiconductor die than would be achievable by wire bonding.

There are three general forms of TAB construction. The first is a single layer or all metal construction; the second is a two layer construction comprising a metal layer with a dielectric backing such as a polyimide; and the third is a three layer construction comprising a metal layer adhesively bonded to a dielectric such as KAPTON polyimide. Further details concerning these respective constructions can be obtained from a review of the aforenoted Dixon article.

A TAB interconnect generally comprises a plurality of narrow leads arranged to extend outwardly from a semiconductor die such that the inner lead portions are adapted to be bonded to the semiconductor die contact pads and the outer lead portions are adapted to bond to a leadframe, circuit board, etc., as desired. In the single layer version, a metal frame supports the elongated leads; whereas, in the two or three layer versions, a polyimide substrate supports the leads.

The TAB leads are formed from a metal foil such as copper foil and are relatively thin, namely one to four mils thick. The thinness of the TAB foil permits the interconnects to be placed more closely together and thereby allow high density interconnection at the semiconductor chip.

TAB tapes may be bumped or unbumped. The bumps act in part as mechanical standoffs from the chip. Unbumped tapes require that the semiconductor chips be bumped in order to make the desired thermocompression bond between the inner lead portion of the TAB leads and the chip. Bumped tapes eliminate the need for bumping of the wafer and, therefore, permit the TAB interlead bond portions to be bonded directly to ordinary semiconductor die bonding pads. The bumped tape normally has a copper projection or bump positioned at the point where it is to be joined to the die. This bump may, if desired, be covered with a suitable plating such as gold, tin or nickel.

In constructing the circuitry in unbumped tape, stamping techniques may be employed as well as photolithographic approaches as described herein. With stamping, the lead spacing is a limiting factor as to the number of leads which may be formed. As the parts to be stamped get smaller, the tools which are very expensive to manufacture, get correspondingly smaller and are easily damaged. Also a number of dies are typically required to sequentially cut out the circuit pattern. In addition, lead stiffness and coplanarity are difficult to control with stamping. Therefore, stamping is usually employed in forming material above about 8 mils in thickness such as, for example, stamping leadframes.

Currently, bumped TAB tapes are commercially available in the single layer variety. The formation of single layer bumped tape is amply illustrated in U.S. Pat. Nos. 4,210,926 to Hacke; 4,308,339 and 4,411,719 to Lindberg and Japanese Patent Publication 55-26613. The formation of single layer bumped tape normally involves coating the metal foil or tape with a photoresist on both sides and forming photoresist images on both sides of the tape. On one side of the tape, the developed photoresist pattern overlies the interconnect fingers and the tape frame leaving bare the areas between the fingers. On the other side of the tape, the developed photoresist pattern overlies the bumps. The resultant structure is then etched. Those portions of the foil which are subjected to etching from both sides etch all the way through. Those portions of the foil, such as the leads, which are subjected to etching from only one side, etch partially therethrough. The result is that the desired step defining an integral bump at the free end of the leads comprising the inner lead bonding portions remains. While the aforenoted process forms a bumped tape with a single etching step, it is difficult to carry out because of the critical alignment that is required between the resist pattern for the bumps on one side of the tape and the lead pattern which appears on the other side of the tape. This is normally accomplished by simultaneous exposure of the photoresist in a highly complex camera arrangement, which permits the two images to be registered.

In order to form a testable bumped tape, U.S. Pat. No. 4,209,355 to Burns adhesively bonds a polyimide substrate film to a metal tape formed by the aforenoted process and forms a three layer tape structure. After the bumped tape is adhered to the substrate, the frame supporting the bumped tape fingers is cut by etching to separate, in an electrical sense, each of the leads from one another. This process has some major deficiencies. The bumped metal tape must be handled in order to adhere it to the polyimide substrate. The leads of the bumped tape, because of their small size and narrow spacing, are extremely susceptible to being damaged during such handling. Further, even after bumped metal tape is adhered to the substrate, it is necessary to undertake a further etching cycle in order to electrically separate the respective leads.

Other approaches to manufacturing testable bump tape are set forth in U.S. Pat. No. 4,510,017 to Barber and U.S. patent application Ser. No. 822,850 entitled Process For Manufacturing Bumped Tape For Tape Automated Bonding And The Product Produced Thereby.

No discussion of bumped tape is complete without reviewing the other alternatives to forming bumped tape as set forth in the patented art. In U.S. Pat. Nos. 3,832,769 to Olyphant, Jr., et al.; 3,838,984 to Crane et al.; and 3,868,724 to Perrino, bumped tapes are illustrated wherein the bumps are formed through holes or vias in the polyimide substrate. In U.S. Pat. Nos.

3,292,241 to Carroll; 3,781,596 to Galli et al.; and 4,259,436 to Tabuchi et al. there are disclosed bumped tapes wherein the bumps on the inner lead ends of the lead are formed by coating or plating. U.S. Pat. No. 4,494,688 to Hiatada et al. describes yet another bumped tape arrangement wherein the bumps are attached or bonded to the lead ends. In U.S. Pat. No. 4,396,457 to Bakermans, the bumps in the inner lead portions of the leads are formed by punching. In U.S. Pat. Nos. 3,984,620 and 4,312,117 to Robillard et al., the bumps and leads are formed on a substrate by vapor deposition.

The aforenoted problems and difficulties can be readily overcome in accordance with this invention through the use of a relatively simple approach which permits TAB tape with lead patterns and bumps, if desired, to be formed simultaneously in a single step. An electrical discharge machining (hereinafter referred to as EDM) apparatus is employed to construct the circuit with very closely spaced leads. Using EDM is thought to be particularly usful in forming circuitry in material having a thickness less than about 8 mils although thicker material may also be processed.

It is an aim of the present invention to form a circuit pattern in a strip of metallic tape which avoids the problems and difficulties encountered by the prior art approaches.

It is a further aim of the present invention to form a circuit pattern in a strip of metallic tape with an electrical discharge machining apparatus whereby the construction can be carried out in a single step operation.

It is yet a further aim of the present invention to form a circuit pattern in a strip of metallic tape with an electrical discharge machining apparatus whereby highly accurate coplanar leads can be constructed.

It is a yet another aim of the present invention to manufacture EDM electrodes using a low cost, highly flexible and accurate technique.

Accordingly, the present invention is directed to the process of forming a circuit pattern in a strip of metallic tape with an electrical discharge machining apparatus having an electrode and a pool of dielectric material. The electrode, having a negative image of the circuit pattern cut into a first end thereof, is submerged in the dielectric material. By controlling the pulsing of direct current across the gap between the electrode and the strip of metallic material for a period of time, a spark discharging across the gap causes small quantities of the metallic foil to be removed so as to cut the circuit pattern. These and other aims will become more apparent from the following description and drawings in which like elements have been given like reference numbers and in which primed or multiprimed numbers comprise similar elements providing similar functions.

Figure 4:
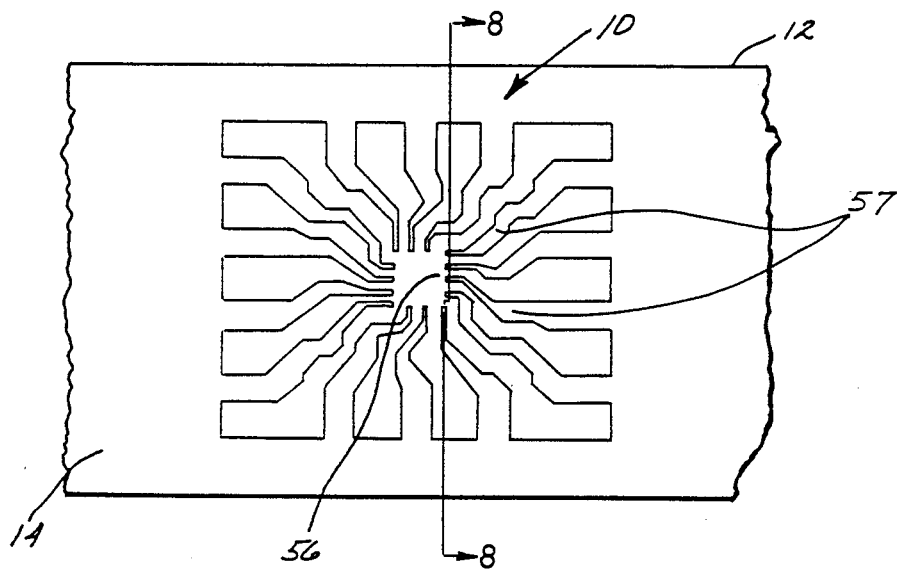
FIG. 4 illustrates the pattern cut in the interconnect foil by the negative pattern illustrated in FIG. 3.
Figure 8:
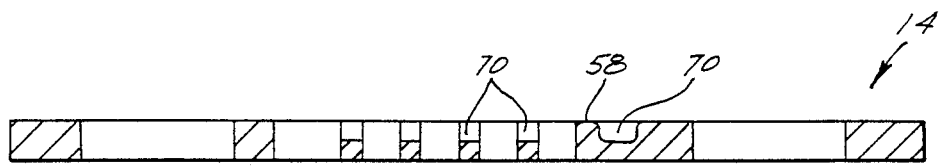

FIG. 8 illustrates a view through 8—8 of FIG. 4. The present invention is directed to the process of forming a circuit pattern 10 in an interconnect tape 12. The interconnect tape 12 is formed of a strip of metallic tape 14. An electrical discharge machining device 16 comprises an electrode 18 and a pool 20 of electrolytic material 21. The electrode 18 has a negative image pattern 22 of the desired circuit pattern 10 cut into a first end 24 thereof. The electrode 18 is disposed in the pool 20 of dielectric material 20 whereby the first end 24 of the electrode 18 having the negative image pattern 22 is submerged in the dielectric material pool 20. The pulsing of direct current between the electrode 18 and the strip of metallic material 14 is controlled. The first end 24 of the electrode 18 is positioned close enough to the strip 14 of metallic tape whereby a spark discharges across the gap 26 between the electrode 18 and the metallic tape 14 removes a small quantity of the metallic foil. The controlled pulsing of direct current is continued for the period of time required to cutout said circuit pattern 10.

Figure 1:
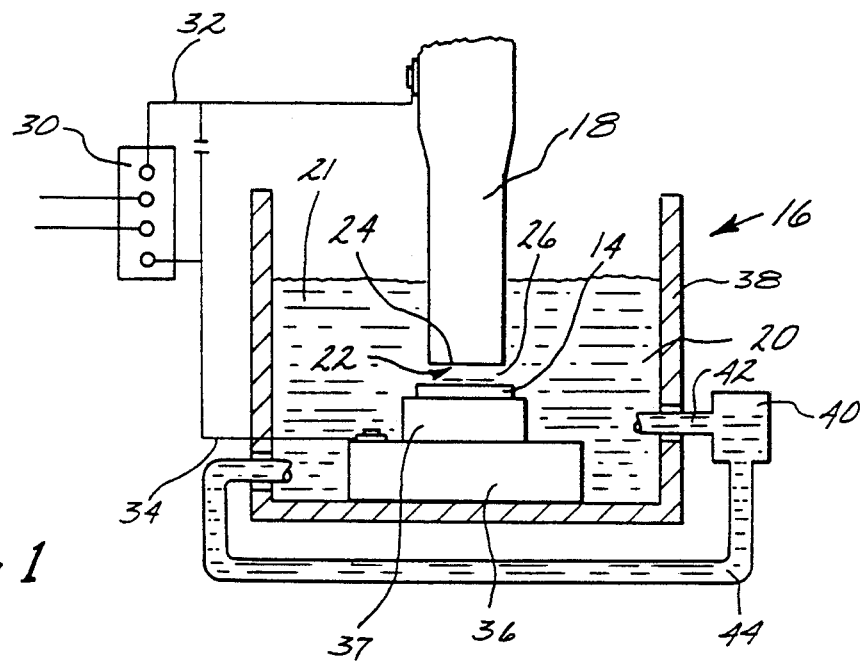
FIG. 1 illustrates a schematic illustration of an electrical discharge machining apparatus as used in the present invention.

Referring to FIG. 1, a schematic illustration of an electrical discharge machining apparatus 16 is provided. This apparatus is particularly useful for producing holes, slots or other cavities in electrically conductive material by means of the controlled removal of material through melting or vaporization by high frequency electrical sparks. A discussion of electrical discharge machining is set forth in the article entitled "Electrical Discharge Machining (EDM)", by John F. Kahles which appeared in the *Metals Handbook, Volume 3*, Pages 227 through 233. The spark discharge is produced by controlled pulsing of direct current between the workpiece which corresponds to metallic tape 14, and an electrode 18. The first end 24 of the electrode 18 and the workpiece 14 are separated by a spark gap 26, typically between about 0.0005" and about 0.020". The end 24 of the electrode 18 and the workpiece 14 are immersed in a pool 20 of dielectric fluid 21. The dielectric fluid 21 in the gap 26 is partially ionized under the pulsed application of a high voltage, thus enabling a spark discharge to pass between the electrode 18 and the workpiece 14. Each spark produces enough heat to melt or vaporize a small quantity of the workpiece 14, leaving a tiny pit or crater in the surface of the workpiece 14. The electric current is usually about 0.5 to about 400 amperes at about 40 to about 400 volts DC, pulsing at about 180 to about 260 thousands cycles per second, and using about 0.0004 to about 400 microfarads of capacitance. The current control apparatus 30 is connected by a line 32 to the electrode 18 and a line 34 to a base 36. The dielectric fluid 21 is pumped through the machine housing 38 by any desired means such as a pump 40 and pipelines 42 and 44. Typically, the dielectric fluid 21 is pumped at a pressure of about 50 pounds per square inch or less.

The electrode 18 may be made of a material selected from the group consisting of graphite, copper, zinc, aluminum, brass, silver-tungsten alloys, steel, nickel, molybdenum and alloys thereof. The particular material from which the electrode is formed is not critical to the present invention and any material which is suitable may be selected. However, the particular material of which the electrode is constructed is compatible with the workpiece being cut. The first end 24 of the electrode has a shape, in the form of a negative image of the shape desired, machined therein. A negative image, in terms of the present invention, is defined as one or more surfaces which project from the end surface of the electrode and form the cutting surface. That is to say, the shape of the surface in a plane closest to the workpiece will cut the shape of that surface into the workpiece. If there is another surface which protrudes a distance from the first surface of the electrode but a lesser distance than the first surface, the second surface will only begin cutting its shape when the first surface moves down closer to the workpiece as it cuts its way therethrought. The second surface does not begin to cut until the electrode has moved close enough to the workpiece so that the spark gap between the second surface and the workpiece is the same as the spark gap between the first surface and the portion of the workpiece that has already been cut. In the present invention, the pattern could be negative image pattern 22 which is formed in the first end surface 24 of the electrode 18, by any desired means including photolithography, machining, vapor deposition and stamping.

Figure 2:
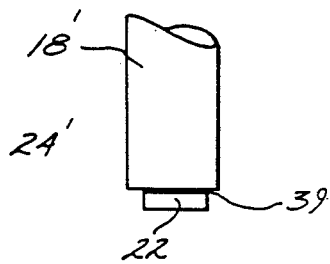
FIG. 2 illustrates an electrode having a pattern affixed to one end in accordance with the present invention.

The electrode 18', as shown in FIG. 2 may have the negative image pattern 22 affixed thereto by any desirable means 39 such as an electrically conductive adhesive, a solder or a mechanical interconnection. An examplary solder is an indium solder.

The EDM machines are often a ram or plunge type in which the electrode is moved by a draw cyclinder with a servo control for tool advance so as to keep the spark gap between the workpiece and the negative image pattern on the end surface of the electrode constant. This control is not shown as it does not make up an essential part of the present invention. It is, however, more fully described in the article by Kahles described hereinbefore.

The pool 20 of dielectric fluid 21 is flushed through the spark gap 26 by any desired means such as a pump 40 and pipelines 42 and 44. The dielectric fluid 21 serves as a spark conductor and coolant and as a flushing medium for disposal of the small particles of material removed from the workpiece. The fluid 21 is required to have a suitable dielectric constant and the ability to ionize readily at applied potentials of about 40 to about 400 volts to conduct the spark discharge. It also quenches the melted or vaporized metal produced by the spark and removes it from the gap. Typically, the fluid is continuously filtered to remove foreign material and the solid products of machining. The dielectric material is typically selected from the group consisting of hydrocarbon oil, kerosene, silicon oils, deionized water, and polar liquids. A specific dielectric material does not form a part of the invention and any desired material may be selected.

For a specific machine, electrode and dielectric fluid, the machining process is controlled by regulating current, duration of discharge, pulse frequency and spark gap. When current begins to flow across the gap 26 at the initiation of a pulse, the current path is very small and the current density is correspondingly high, producing temperatures of several thousand degree centigrade. As the discharge continues, the current path gradually broadens, and the current density decreases. Each spark melts or vaporizes a small quantity of metal from the workpiece 14, leaving a small crater in the surface. At the same time, a similar but lesser cratering effect occurs on the first end 24 of the electrode 18 causing the electrode to require replacement.

The metal removal rate depends on the volume of metal removed by each spark and on the frequency of discharge, and is thus directly related to the current and the duty cycles.

The present invention is particularly directed to using EDM for forming a circuit pattern 10 as shown in FIG. 4 in an interconnect tape 12. The interconnect tape 12 can comprise a strip of metallic tape 14 of any desired metal or alloy selected from the group consisting of copper, aluminum, iron, nickel and alloys thereof. It is also within the terms of the present invention to use any other desired metal or alloy as required. The interconnect tape typically has a thickness of from about 1 to about 8 mils and, preferably, from about 1 to about 4 mils.

Figure 3:
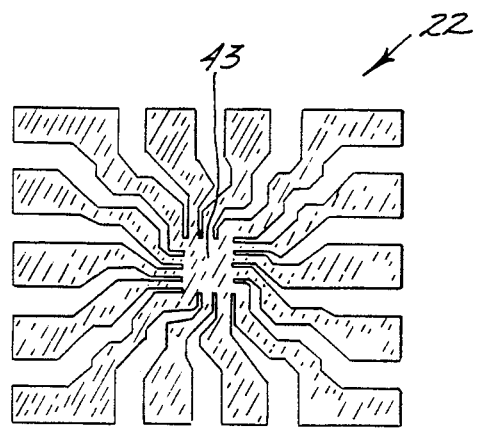
FIG. 3 illustrates a negative pattern provided on one end of the electrode in accordance with the present invention.
Figure 5:
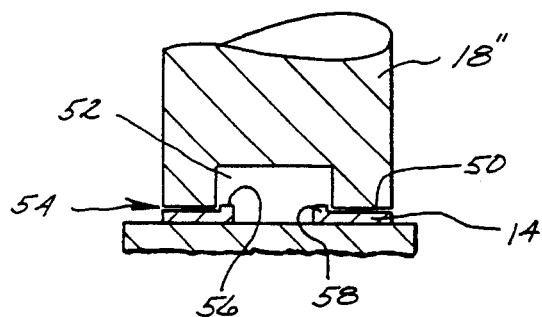
FIG. 5 illustrates a negative pattern provided on one end of an electrode for forming bumps on TAB tape.

The first end 24 of the electrode 18 has the negative image of the desired circuit pattern formed therein. For example, the circuit pattern 10 can be formed with the negative image circuit pattern 22 illustrated in FIG. 3. The negative image circuit pattern may be formed by any desired technique including photolithography, machining, EDM, stamping, vapor deposition and combinations thereof into the first end surface 24 of the electrode 18. It is also within the terms of the present invention to affix the negative image pattern 22 on the end surface 24 of the electrode 18 by forming the negative image circuit pattern into a metallic strip 43 by any desired technique from the group consisting of photoetching, electrical discharge machinining, stamping, vapor deposition and combinations thereof. It is also within the terms of the present invention to form the negative image of the circuit pattern in the metallic strip 43 by any other desired technique. The metallic strip 43 is then bonded to the end surface 24' of the electrode 18' by any desired means including a layer 39 of solder. The metal strip 43 is preferably formed of any metal selected from the same group of materials from which the electrode is formed. However, it is within the terms of the present invention to form the tape 43 from any other desired material.

Once the EDM apparatus is set up, a strip of metallic tape 14 is positioned on a fixture 37 which provides an electrical flow path from the base 36. The current, the duration of the discharge and the pulse frequency is regulated so as to form a circuit pattern 10 as shown in FIG. 4. The advantages of using the EDM approach is the elimination of the steps required for photolithographically etching a circuit in a metallic tape, as described above, and the ability to form the circuit patterns with very close spacing, with a coplanar configuration and with minimal distortion which may be very difficult using stamping technology.

It is also within the terms of the present invention to form bumped TAB tape using the EDM apparatus. After the circuit pattern 10 is formed in the interconnect tape 14, an electrode 18" having an end surface 50 with a cavity 52 is disposed above the circuit pattern 10 cut into the tape 14. By controlling the pulsing of the direct current across the gap 54 between the end surface 50 of the electrode and the tape 14, the circuit pattern 10, with the exception of the inner tips 56 of leads 57, are cut so as to leave the bumps 58 on the tape 14.

Figure 6:
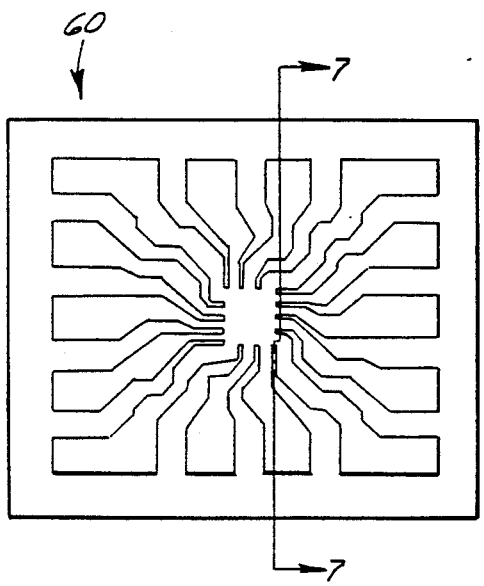
FIG. 6 illustrates a negative pattern provided on one end of an electrode whereby bumps can be formed on TAB tape in a single step.

Referring to FIG. 6, there is shown a negative pattern 60 which may be formed on the end of an electrode 18 or cut into a strip of material and then affixed to the end of the electrode 18' as described hereinbefore. The negative pattern 60 has first, second and third surfaces 62, 64 and 66, respectively, shown in FIG. 7, which enable a TAB tape 14, as shown in FIGS. 4 and 8, to be provided with bumps 58 located on the ends 56 of the leads 57. The negative pattern 60 has been cut through plane 7—7 and rotated 180° in FIG. 7 so as to illustrate the position of the negative pattern on the electrode. Note that the top surface of the pattern 60 is illustrated as broken in FIG. 7. This indicates that the pattern may be cut directly into the electrode as described hereinbefore or cut into a strip of material and then affixed to the end of the electrode. The latter approach is thought to be desirable because as the negative pattern deteriorates, it can easily be replaced on the end of the electrode 18'; therefore, the following description will incorporate this approach.

Figure 7:
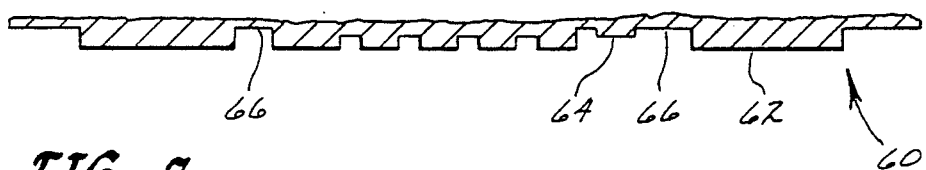
FIG. 7 illustrates a view through 7—7 of FIG. 6.

The method of using the negative pattern 60 to form a TAB tape in a single step can be more fully understood with the following explanation. First, the surface 62 of the pattern 60 is positioned with respect to the strip or workpiece 14 to provide a specified spark gap so that the material of the strip 14 is first being cut to the shape of surface 62. As the cutting proceeds, the electrode 18' adjusts its position to maintain the gap between the surface 62 and the uncut portion of the strip 14 substantially constant. This causes the electrode 18' to move closer to the workpiece 14. At a certain point, the surface 64 is positioned with respect to the workpiece 14 the required spark gap to begin cutting the shape of the surface 64 into the strip 14. The height of the surfaces 62 and 64 is set so that the surface 66 is preferably positioned with respect to the strip 14 so that no cutting of the strip by the pattern of the surface 66 occurs. However, if desired, it is within the terms of the present invention to also cut into the strip 14 with surface 66, if desired. The resulting TAB design, as shown in FIGS. 4 and 8, include bumps 58 on the ends 56 of the leads 57. As shown in FIG. 8, the valleys 70 formed in the leads 56 enable the bumped end 58 to be bonded to a chip while the valley 70 prevents the remainder of the lead 56 from contacting the chip. FIG. 8 has been rotated 180° in order that it matches the cross section through the negative image 60 as shown in FIG. 7. Moreover, FIG. 8 is positioned as it would appear on the support 37 during the cutting process.

The patents, patent applications and articles set forth in this application are intended to be incorporated in their entireties by reference herein.

It is apparent that there has been provided in accordance with this invention a process of forming a circuit pattern in a metallic tape by electrical discharge machining which satify the objects, means and advantages set forth hereinabove. While the invention has been described in combination with the embodiments thereof, it is evident that many alternatives, modifications, and variations will be apparent to those skilled in the art in light of the foregoing description. Accordingly, it is intended to embrace all such alternatives, modifications and all variations as fall within the spirit and broad scope of the appended claims.

We claim:

1. The process of forming a circuit pattern in an interconnect tape, comprising the steps of:
   providing said interconnect tape of a strip of metallic material;
   providing an electrical discharge machining device comprising an electrode and a pool of dielectric material;
   providing said electrode with a negative image of the circuit pattern cut into a first end of said electrode;
   submerging said first end of said electrode in said pool of dielectric material;
   controlled pulsing of direct current between said electrode and said strip of metallic material;
   positioning the first end of said electrode close enough to said strip of metallic material whereby a spark discharges across the gap between said electrode and said metallic material so that a small quantity of the metallic material is removed; and
   continuing said controlled pulsing of direct current for a period of time required to cut said circuit pattern in said interconnect tape.

2. The process of claim 1 including the step of forming the negative image of the circuit pattern in said first end of said electrode.

3. The process of claim 2 wherein said step of forming the negative image of the circuit pattern in said first end of said electrode by means selected from the group consisting of photolithography, machining, electrical discharge machining, stamping, vapor deposition and combinations thereof.

4. The process of claim 2 wherein said step of forming the negative image of the circuit pattern in said first end of said electrode includes the steps of:
   cutting the negative image of the circuit pattern into a metallic strip; and
   bonding the metallic strip to the first end surface of the electrode.

5. The process of claim 4 including the step of bonding the metallic strip to the first end surface of the electrode by means selected from the group consisting of electrically conductive adhesives, solder and mechanical bonding.

6. The process of claim 5 including the step of cutting the negative image of the circuit pattern into the metallic strip by techniques from the group consisting of photolithography, electrical discharge machining, machining, stamping, vapor deposition and combinations thereof.

7. The process of claim 2 including the step of selecting said electrode from a material selected from the group consisting of graphite, copper, zinc, aluminum, brass, silver-tungsten alloys, steel, nickel, molybdenum and alloys thereof.

8. The process of claim 7 including the step of selecting said interconnect tape having a thickness from about 1 to about 8 mils.

9. The process of claim 7 including the step of selecting said interconnect tape having a thickness from about 1 to about 4 mils.

10. The process of claim 9 wherein said interconnect tape is formed of a metal selected from the group consisting of copper, iron, aluminum, nickel and alloys thereof.

11. The process of claim 2 including the step of flushing said dielectric material through the spark gap to serve as a spark conductor, a coolant and a flushing medium to dispose of the small particles removed from said interconnect tape.

12. The process of claim 11 including the step of selecting said dielectric material from the group consisting of hydrocarbon oil, kerosine, silicone oils, deionized water and polar liquids.

13. The process of claim 11 including the step of regulating the current the duration of the discharge and the pulse frequency.

14. The process of claim 2 including the steps of:
   providing said electrode with a cavity in the first end;

positioning said electrode with the cavity on the first end adjacent the interconnect tape having the circuit pattern cut therein, and removing material from said interconnect tape except from the inner tips of the circuit pattern so as to leave a circuit pattern having bumps in the inner tips thereof.

15. The process of claim 2 including the steps of forming the negative image of the circuit pattern wherein three spaced surfaces project from the end of said electrode whereby a circuit pattern having bumps and valleys on the ends of the leads of the circuit pattern is formed in the interconnect tape in a single step.

16. The process of claim 15 including:

the first surface projecting the furthest distance from the electrode for cutting a plurality of holes through the interconnect tape to form the leads of said circuit pattern;

the second surface projecting a distance less than that of said first surface from said electrode for cutting the valleys in the leads of the interconnect tape whereby bumps remain on the ends of said leads; and a third surface projecting from the electrode less than said second surface.

* * * * *